(12) United States Patent
Wang

(10) Patent No.: US 6,303,960 B1
(45) Date of Patent: Oct. 16, 2001

(54) LOW VOLTAGE FLASH MEMORY CELL

(75) Inventor: Ling-Sung Wang, Hsinchu (TW)

(73) Assignee: Taiwan Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 09/437,503

(22) Filed: Nov. 10, 1999

(30) Foreign Application Priority Data

May 18, 1999 (TW) .............................................. 088108047

(51) Int. Cl.⁷ .................................................. H01L 29/72
(52) U.S. Cl. ........................ 257/316; 257/317; 257/321; 257/618
(58) Field of Search .................................... 257/314, 315, 257/316, 317, 321, 618

(56) References Cited

U.S. PATENT DOCUMENTS 5,391,510 * 2/1995 Hsu et al. .............................. 257/314

* cited by examiner

Primary Examiner—Edward Wojciechowicz
(74) Attorney, Agent, or Firm—Blakely Sokoloff Taylor & Zafman, LLP

(57) ABSTRACT

A process for manufacturing flash memories is disclosed. In one embodiment, a first oxide layer is deposited over a substrate and then, a first polysilicon layer is deposited over the oxide layer. When the first polysilicon layer is etched and formed, an ONO (oxide nitride oxide) layer is deposited over the first polysilicon layer. Then, portions of the ONO layer and the first polysilicon layer are removed to form two nitride fences. A tunnel oxide layer in a conformal shape is subsequently deposited over said nitride fences, some portions of the first oxide layer, and said substrate. After depositing of tunnel oxide layer, a floating gate polysilicon layer, a second oxide layer, and a second polysilicon layer are deposited. Portions of the second polysilicon layer, the second oxide layer, the floating gate layer, and the tunnel oxide layer are, subsequently, removed. Finally, a drain well and a source well are formed in the substrate.

17 Claims, 4 Drawing Sheets

LOW VOLTAGE FLASH MEMORY CELL

BACKGROUND OF THE INVENTION

1. Field of the Invention

The present invention relates generally to the field of semiconductors, more specifically, the present invention relates to a process of manufacturing flash memory chips.

2. Description of the Related Art

Non-volatile semiconductor memories use a variety of semiconductor memory cell designs. One type of memory cell is a "flash" memory cell that is electrically erasable and electrically programmable. In other words, typical flash memory cells may be programmed, erased or read by a user. Once a flash memory cell is programmed, the data is stored in the flash memory cells until the data is erased or reprogrammed.

To achieve higher speed and higher densities, the physical dimension or size of each flash memory cell has been scaled down. A problem associated with reducing the size of a flash memory cell is the decreasing of the overlap area between the floating gate and the control gate. The size of the overlap area determines the coupling ratio between the control gate and floating gate, where the coupling ratio, which will be discussed later, affects the reliability of the flash memory. In short, a decrease in the overlap area may cause the flash memory to fail.

FIG. 1A is a semiconductor structure 5 having a circuit layout of a conventional flash memory cell. A substrate 100, a device isolation region 102, a floating gate layer 106, control gate layers 110, a plurality of source regions 112, and a drain region 114 are shown. A conventional method for increasing the overlap area is to deposit the control gate layer 110 in an angular shape as shown in FIG. 1A. A problem with this method is that when the overall physical size of the flash memory cell decreases, the area of the angular shaped control gate layer 110 also decreases. A decrease in the area of the angular shaped control gate layer 110 also causes the coupling ratio to decrease.

FIG. 1B is a cross-sectional view of the semiconductor structure of FIG. 1A having a conventional flash memory layout. The semiconductor structure includes a substrate layer 100, a drain region 114, source regions 112, a tunneling oxide layer 104, floating gate layers 106, oxide layers 108, and controlling gate layers 110. The semiconductor structure includes capacitance $C_{FG}$, $C_B$, $C_S$, and $C_D$. $C_{FG}$ indicates the capacitance between the floating gate layer 106 and the controlling gate layer 110. $C_B$ indicates the capacitance between the floating gate layer 106 and the substrate 100. $C_S$ is the capacitance between the floating gate layer 106 and the source region 112. $C_D$ represents the capacitance between the floating gate layer 106 and the drain region 114.

FIG. 1C illustrates a distribution of capacitance within the semiconductor structure having a circuit layout of a conventional flash memory. The coupling ratio may be represent in the following equation using $C_{FG}$, $C_B$, $C_S$, $C_D$.

$$\text{Coupling Ratio} = \frac{C_{FG}}{C_{FG} + C_B + C_S C_D}$$

From the equation, if $C_{FG}$ is increased, the coupling ratio is also increased. Since enlarging the overlap area increases $C_{FG}$, increasing in overlap area also increases the coupling ratio. However, enlarging the overlap area typically increases the size of the flash memory cell.

Therefore, there is a need to have a mechanism to increasing overlap area without increasing the size of the flash memory cell.

SUMMARY OF THE INVENTION

A method and an apparatus of a semiconductor process for manufacturing flash memory cells are described. The process may be used to fabricate flash memory chips having high coupling ratio between the floating gates and controlling gates.

In one embodiment, a first oxide layer is grown over a substrate and a first polysilicon layer is subsequently deposited over the first oxide layer. When the first polysilicon layer is properly etched and formed, an ONO (oxide nitride oxide) layer is deposited over the first polysilicon layer. Then, portions of the ONO layer and the first polysilicon layer are removed to form two nitride fences. A conformal shaped tunnel oxide layer is, subsequently, deposited over said nitride fences, some portions of the first oxide layer, and said substrate. After depositing of the tunnel oxide layer, a floating gate polysilicon layer, a second oxide layer, and a second polysilicon layer are, subsequently, deposited over the conformal shaped tunnel oxide layer. A portion of the second polysilicon layer, the second oxide layer, the floating gate layer, and the tunnel oxide layer are, subsequently, removed. Finally, a drain region and a source region are formed in the substrate.

Additional features and benefits of the present invention will become apparent from the detailed description, figures and claims set forth below.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

A method and an apparatus of a semiconductor process for manufacturing flash memory cells are described.

In the following description numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

In one embodiment, the semiconductor process employs a nitride fence to increase the overlap area between the controlling gate and floating gate to improve the coupling ratio. For example, this process may be used to manufacture 1 gigabytes flash memory using 0.24 $\mu m^2$ cell process with 0.18 $\mu m$ isolation width. It should be appreciated that this manufacturing process can also be used to manufacture other integrated circuits.

Figure 1A:
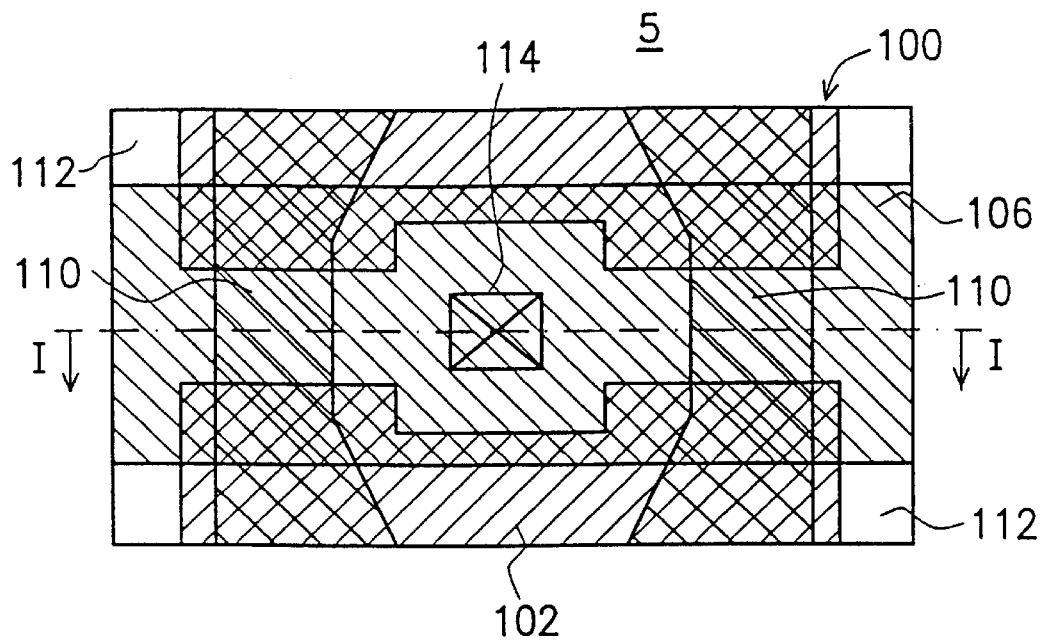
FIG. 1A is a semiconductor structure having a layout of a conventional flash memory cell.
Figure 1B:
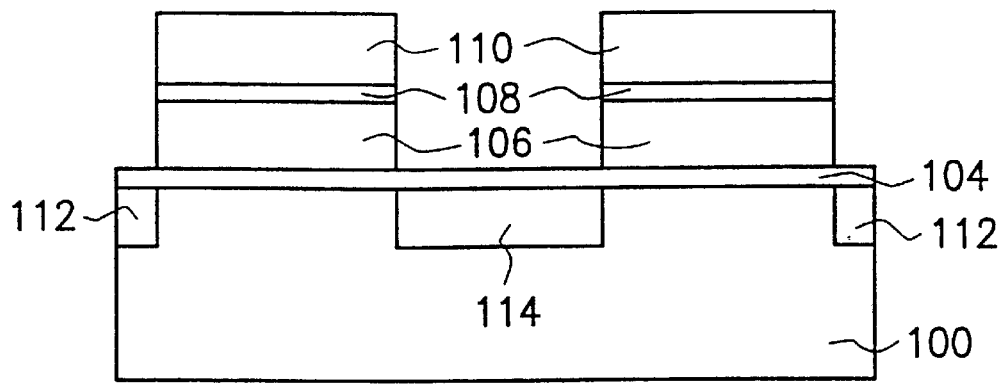
FIG. 1B is a cross-sectional view of the semiconductor structure of FIG. 1A.
Figure 1C:
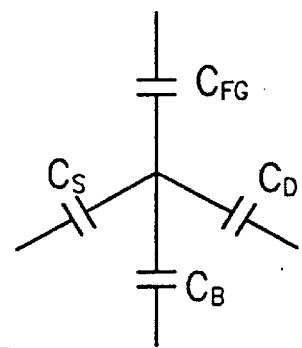
FIG. 1C is a circuit diagram illustrating a distribution of capacitance within the semiconductor structure.
Figure 2:
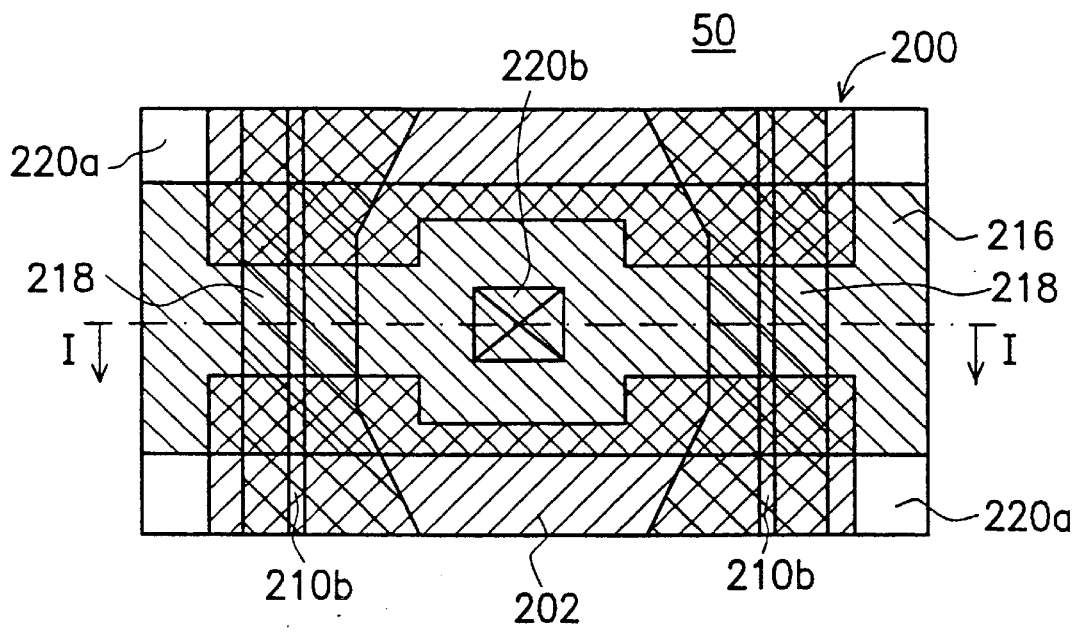
FIG. 2 is a semiconductor structure including a layout of a flash memory layout having a nitride fence.

FIG. 2 is a semiconductor structure 50 with a layout of a flash memory cell having a nitride fence. Referring back to FIG. 2, a substrate 200, a device isolation region 202, a floating gate layer 216, two controlling gate layers 218, source regions 220a, a drain region 220b, and two nitride fences 210b are shown.

In one embodiment, the thickness of nitride fence 210b is about 150 Å ("Angstrom") while the height of nitride fence 210b is about 1500 Å. Since floating gate layer 216 and controlling gate layer 218 are deposited in an envelope or conformal shape, hereinafter referred to as conformal shape, over the nitride fence 210b, the overlap area between floating gate layer 216 and controlling gate layer 218 is substantially increased. As discussed previously, increasing in the overlap area will increase the coupling ratio. Consequently, with enlarged overlap area, control gate will be able to apply enough current to drive flash memory cell 50.

Device isolation region 202, in one embodiment, is created using a conventional oxidation process, such as, for example, a local oxidation ("LOCOS") process. Alternatively, device isolation region 202 may be created by forming a shallow trench isolation ("STI") region. Other methods of oxidation to form device isolation region 202 are possible, but they are not necessary to understanding the invention.

Figure 3A:
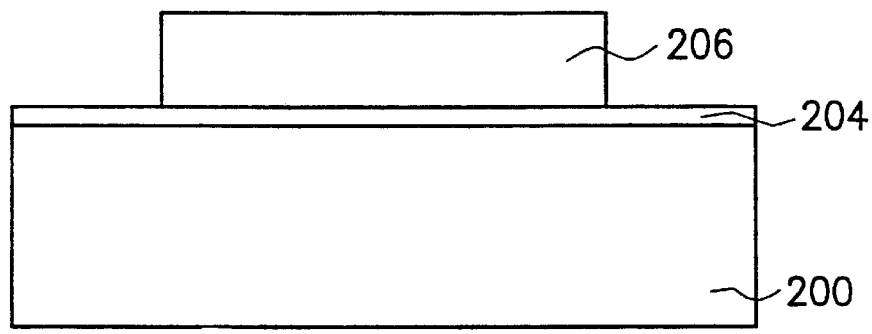
FIG. 3A is a cross-sectional view of a semiconductor structure having a substrate with an oxide layer and a polysilicon layer.

FIG. 3A shows a cross-sectional view of a semiconductor structure having a substrate 200, an oxide layer 204, and a polysilicon layer 206. In one embodiment, substrate 200 is made of silicon. Alternatively, substrate 200 is made of quartz. It should be appreciated that other types of substrate are possible, but they are not necessary to understanding the invention.

A process of thermal oxidation may be used to create oxide layer 204 over substrate 200. The material used to create oxide layer 204 may be silicon dioxide ($SiO_2$). Alternatively, the material used to create oxide layer 204 may be silicon nitride ($Si_3N_4$). The thickness of oxide layer 204, in one embodiment, could be in a range between 70 Å and 120 Å. Alternatively, the thickness of oxide layer 204 is about 90 Å.

Polysilicon layer 206, in one embodiment, which is undoped, is deposited over oxide layer 204 using a deposition process, such as, for example, LPCVD ("Low Pressure Chemical Vapor Deposition") process. The thickness of polysilicon layer 206, in one embodiment, may be in a range between 1200 Å to 1800 Å. Alternatively, the thickness of polysilicon layer 206 may be around 1500 Å.

After deposition of polysilicon layer 206, an etch process may be used to remove portions of polysilicon layer 206 to form a conformal shaped layer over oxide layer 204 as shown in FIG. 3A. The etch process, in one embodiment, is the photolithography. Other etch processes for removing portions of polysilicon layer 206 may be used.

Figure 3B:
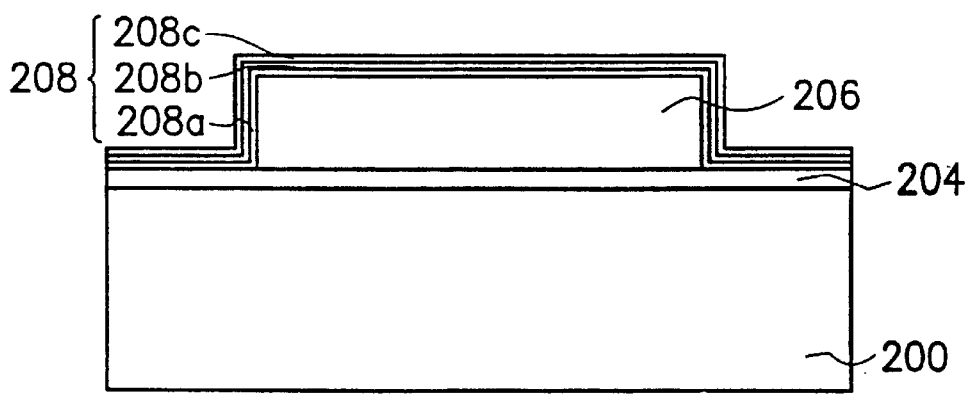
FIG. 3B is a cross-sectional view of the semiconductor structure of FIG. 3A after an ONO (oxide nitride oxide) layer has been deposited.

FIG. 3B shows a cross-sectional view of the semiconductor structure shown in FIG. 3A after an ONO ("oxide nitride oxide") layer 208 has been deposited. ONO layer 208 is deposited in a conformal shaped layer over polysilicon 206 and oxide layer 204. ONO layer 208, in one embodiment, includes two high-temperature oxidation ("HTO") sub-layer 208a, 208c and a silicon nitride sub-layer 208b.

The thickness of HTO sub-layers 208a, 208c may be in a range of 20 Å to 40 Å while the thickness of silicon nitride sub-layer is in a range of 140 to 160 Å. Alternatively, the thickness of HTO sub-layers 208a, 208c may be 30 Å while the thickness of silicon nitride sub-layer is 150 Å. To deposit ONO layer 208, a process of chemical vapor deposition (CVD) may be used. It should be appreciated that other process for depositing of ONO layer 208 may be used.

Figure 3C:
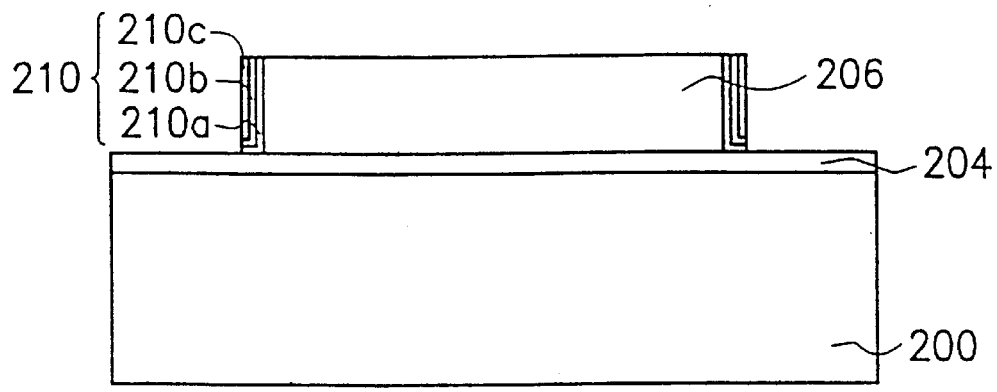
FIG. 3C is a cross-sectional view of the semiconductor structure of FIG. 3B after a portion of ONO layer is removed.

FIG. 3C shows a cross-sectional view of the semiconductor structure shown in FIG. 3B after portions of ONO layer 210 has been removed. Referring back to FIG. 3C, a portion of ONO layer 210, which is laid over the top of polysilicon layer 206, is removed. Also, two portions of ONO layer 210, which are laid over oxide layer 204, are removed. The remaining portions of ONO layer 210 forms two spacer 210, which are situated next to polysilicon layer 206.

Spacer 210, in one embodiment, includes a first HTO component 210a, a silicon nitride component 210b, and a second HTO component 210c. The height of spacer 210 approximately equals to the thickness of polysilicon layer 206. In one embodiment, the height of spacer 210 is about 1500 Å.

Figure 3D:
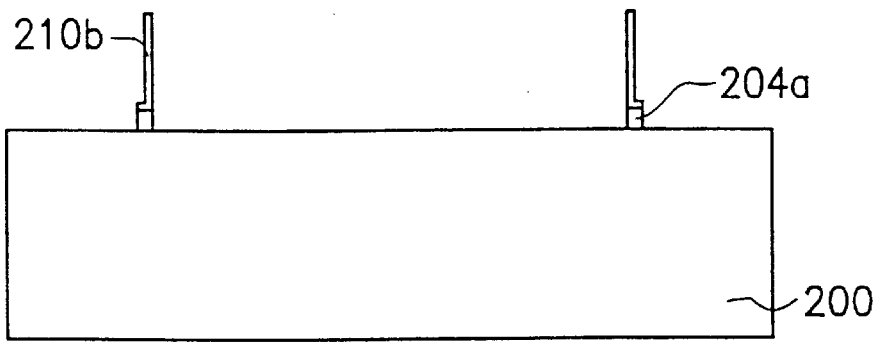
FIG. 3D is a cross-sectional view of the semiconductor structure of FIG. 3C after the polysilicon layer and oxide layer are removed.

FIG. 3D is a cross-sectional view of the semiconductor structure of FIG. 3C after polysilicon layer 206 and a portion of oxide layer 204 are removed. Referring back to FIG. 3D, a substrate 200, two oxide blocks 204a, and two nitride fences 210b are shown.

A dry etch process, in one embodiment, is used to remove polysilicon layer 206. The dry etch process, in one embodiment, is plasma etch process and the etch rate for the process is in the range of 50 to 80. After polysilicon layer 206 has been removed, a wet etch process may be employed to remove first and second HTO components 210a, 210c, and portion of oxide layer 204. The wet etch process, in one embodiment, is an etch process using Dilute Hydrofluoric Acid ("DHF") technology. After the wet etch process, the semiconductor structure contains a substrate 200, two oxide blocks 204a, and two nitride fences 210b.

The height of nitride fence 210b, in one embodiment, is in a range between 1300 Å to 1700 Å and the width of nitride fence 210b is in a range of 130 Å to 170 Å. Alternatively, the height of nitride fence 210b may be 1500 Å and the width of nitride fence 210b may be 150 Å. The dimension of nitride fence 210b may change if the processing technology changes. A function of nitride fence 210b is to facilitate a deposition of a conformal shaped layer, which increases the overlap area. It should be understood that the fence 210b could be made in materials other than nitride so long as it can facilitate a deposition of a conformal shaped layer.

The height of oxide block 204a, in one embodiment, is in a range of 70 Å to 140 Å and the width of oxide block 204a is in a range of 140 Å to 190 Å. Alternatively, the height of oxide block 204a is around 90 Å and the width of oxide block 204a is 150Å. The size of oxide block 204a, alternatively, may be the same size as the bottom side, which is in contact with oxide block 204*a*, of nitride fence 210*b*. It should be noted that the dimension of oxide block 204*a* might vary in response to the size of nitride fence 210*b*.

Figure 3E:
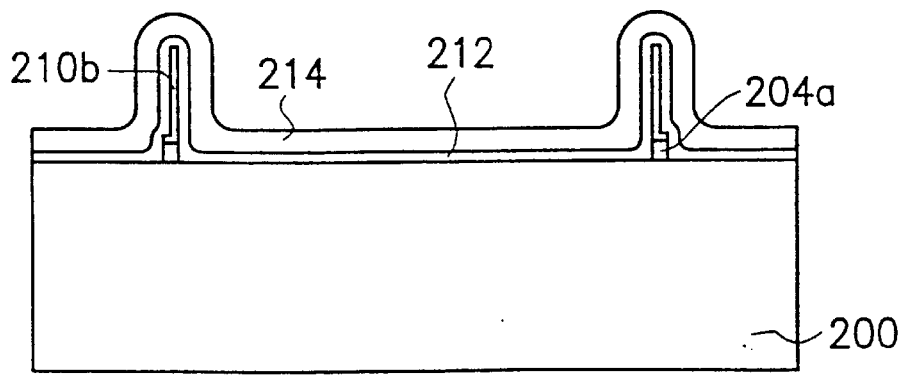
FIG. 3E is a cross-sectional view of the semiconductor structure of FIG. 3D after a tunnel oxide layer and floating gate polysilicon are deposited.

FIG. 3E is a cross-sectional view of the semiconductor structure of FIG. 3D after a tunnel oxide layer 212 and a floating gate polysilicon layer 214 have been deposited. In one embodiment, a tunnel oxide layer 212 is deposited in a conformal shaped layer over nitride fences 210*b*, oxide blocks 204*a*, and the surface of substrate 200. In this embodiment, silicon dioxide may be used to deposit tunnel oxide layer 212 using thermal oxidation. The thickness of tunnel oxide layer 212, in one embodiment, is in a range of 70 Å to 110 Å. Alternatively, the thickness of tunnel oxide layer 212 is around 90 Å.

After deposition of tunnel oxide layer 212, a floating gate polysilicon layer 214, which is a doped polysilicon layer, is deposited in a conformal shaped layer over tunnel oxide layer 212. In one embodiment, an implant doping process, such as, for example, In-Situ Doping or ion implantation, is used to dope floating gate polysilicon layer 214. In this embodiment, a process of large angle implant dope may be used to ensure doping uniformity over floating gate polysilicon layer 214.

Figure 3F:
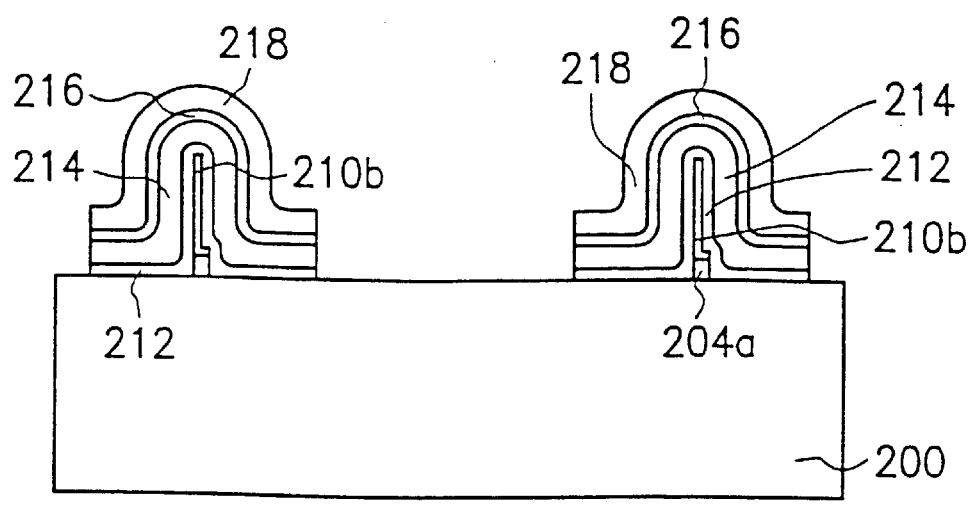
FIG. 3F is a cross-sectional view of the semiconductor structure of FIG. 3E after an ONO layer and a new polysilicon layer are deposited.

FIG. 3F is a cross-sectional view of the semiconductor structure of FIG. 3E after an ONO layer and another polysilicon layer have been deposited. In one embodiment, a process of CVD may be used to deposit an ONO layer 216 where ONO layer 216 includes a first sub-layer of HTO, a sub-layer of silicon nitride ($Si_3N_4$), and a second sub-layer of HTO. The thickness for both first and second sub-layer of HTO, in one embodiment, is in a range of 50 to 70 Å. Alternatively, the thickness for both first and second sub-layer of HTO is approximately 60 Å. The thickness of silicon nitride sub-layer is in a range of 90 to 120 Å. Alternatively, the thickness of silicon nitride sub-layer is approximately 100 Å. After deposition of ONO layer 216, an etch process is used to remove peripheral ONO layer 216. A peripheral gate oxide, which is not shown in FIG. 3F, is deposited to build components for the flash memory cell.

A process of CVD, in one embodiment, is used to deposit a polysilicon layer 218 in a conformal shaped layer over ONO layer 216. Polysilicon layer 218, in this embodiment, is used as a control gate. After deposition of polysilicon layer 218, a process of etch is used to remove portion of polysilicon layer 218, ONO layer 216, floating gate layer 214, tunnel oxide layer 212 to form a semiconductor structure having a conformal shaped control gates.

Figure 3G:
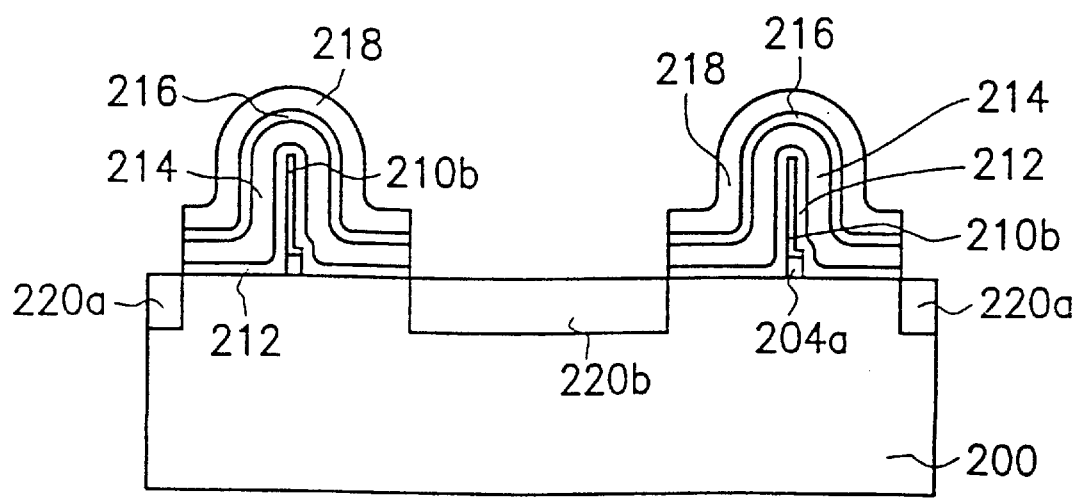
FIG. 3G is a cross-sectional view of the semiconductor structure of FIG. 3F after a drain region and two source regions are deposited.

FIG. 3G is a cross-sectional view of the semiconductor structure of FIG. 3F after a drain region (well) and two source regions (wells) have been deposited. In one embodiment, a conventional S/D implant process may be used to form a drain region 220*b* and source regions 220*a*. After this step, a semiconductor structure having a flash memory cell with nitride fences has been fabricated.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

Thus, a method and a system for manufacturing a flash memory cell using nitride fence have been described.

We claim:
1. A flash memory cell comprising:
    a substrate having at least one drain region and at least one source region;
    at least one fence deposited over said substrate;
    a tunnel oxide layer formed over said substrate and said fence;
    a floating gate formed from a first polysilicon layer, said floating gate formed over said tunnel oxide layer;
    a dielectric layer formed over said floating gate; and
    a control gate formed from a second polysilicon layer, said control gate formed over said dielectric layer.
2. The device of claim 1, wherein said fence is a nitride fence.
3. The device of claim 1, wherein said fence further includes an oxide block that separates said fence from the surface of said substrate.
4. The device of claim 1, wherein said fence is approximately 1500 Å tall and approximately 150 Å wide.
5. A method for manufacturing flash memory comprising:
    depositing a first oxide layer over a substrate;
    forming a second polysilicon layer over said first oxide layer;
    depositing nitride materials on side of said second polysilicon layer;
    forming a nitride fence after said second polysilicon layer is removed;
    depositing multiple conformal shaped layers over said nitride fence to increase the overlap area between said multiple conformal shaped layers, wherein said depositing multiple conformal shaped layers includes:
        depositing a tunnel oxide layer over said nitride fences;
        depositing a floating gate polysilicon layer over said tunnel oxide layer;
        depositing an ONO layer over said floating gate polysilicon layer; and
        depositing a second polysilicon layer over said second oxide layer;
    removing a portion of said second polysilicon layer, said ONO layer, said floating gate layer, and said tunnel oxide layer over said substrate; and
    forming a drain well and a source well in said substrate.
6. A method for manufacturing flash memory comprising:
    providing a substrate;
    depositing a first oxide layer over said substrate;
    depositing a first polysilicon layer over said oxide layer;
    forming at least one ONO spacer at side of said first polysilicon layer;
    removing said first polysilicon layer;
    forming at least one nitride fence by removing HTO portions from said ONO spacer;
    forming at least one oxide block situated between said nitride fence and said substrate by removing a portion of said first oxide layer;
    depositing a conformal shaped tunnel oxide layer over said nitride fence, said oxide block, and said substrate;
    depositing a floating gate polysilicon layer over said tunnel oxide layer;
    depositing a second oxide layer over said floating gate polysilicon layer;
    depositing a second polysilicon layer over said second oxide layer;
    removing a portion of said second polysilicon layer, said second oxide layer, said floating gate layer, and said tunnel oxide layer over said substrate; and forming a drain well and a source well in said substrate.

7. The method of claim 6, wherein said first oxide layer includes silicon dioxide.

8. The method of claim 6, wherein said ONO includes high temperature oxidation.

9. The method of claim 6, further utilizing a dry etch process having an etch rate between 50 and 80 to remove said first polysilicon layer.

10. The method of claim 6, wherein said nitride fence is about 1500 Å.

11. The method of claim 6, wherein said oxide block is in similar size as bottom side of said nitride fence.

12. The method of claim 6, wherein said tunnel oxide layer includes silicon dioxide.

13. The method of claim 6, wherein said second oxide layer includes a first high temperature oxidation sub-layer, a silicon nitride sub-layer, and a second high temperature oxidation sub-layer.

14. A method for manufacturing a 3-D flash memory comprising:

providing a substrate;

depositing a first silicon dioxide layer over said substrate;

depositing a first polysilicon layer over said first silicon dioxide layer;

depositing a second silicon dioxide layer over said first polysilicon layer;

depositing a silicon nitride layer over said second silicon dioxide layer;

depositing a third silicon dioxide layer over said silicon nitride layer;

forming at least one ONO spacer at side of said first polysilicon layer by removing portion of said second silicon dioxide layer, said silicon nitride layer, and said third silicon dioxide layer;

removing said first polysilicon layer;

forming at least one nitride fence by removing HTO portion from said ONO spacer;

forming at least one oxide block situated between said nitride fence and said substrate by removing a portion of said first oxide layer;

depositing a tunnel oxide layer in a conformal shaped layer over said nitride fence, said oxide block, and said substrate;

depositing a floating gate polysilicon layer over said tunnel oxide layer;

depositing an oxide layer over said floating gate polysilicon layer;

depositing a second polysilicon layer over said oxide layer;

removing a portion of said second polysilicon layer, said oxide layer, said floating gate layer, and said tunnel oxide layer over said substrate; and forming a drain well and a source well in said substrate.

15. The method of claim 14, wherein said second and third silicon dioxide layers include high temperature oxidation.

16. The method of claim 14, further utilizing a dry etch process having an etch rate of 50 to 80 to remove said first polysilicon layer.

17. The method of claim 14, wherein said nitride fence is about 1500 Å.

* * * * *